United States Patent
Wloczysiak et al.

(10) Patent No.: US 10,230,413 B2
(45) Date of Patent: Mar. 12, 2019

(54) FILTERING ARCHITECTURES AND METHODS FOR WIRELESS APPLICATIONS

(71) Applicant: SKYWORKS SOLUTIONS, INC., Woburn, MA (US)

(72) Inventors: Stephane Richard Marie Wloczysiak, Irvine, CA (US); Joel Richard King, Newbury Park, CA (US)

(73) Assignee: Skyworks Solutions, Inc., Woburn, MA (US)

(*) Notice: Subject to any disclaimer, the term of this patent is extended or adjusted under 35 U.S.C. 154(b) by 0 days.

(21) Appl. No.: 15/687,802

(22) Filed: Aug. 28, 2017

(65) Prior Publication Data
US 2018/0062682 A1    Mar. 1, 2018

Related U.S. Application Data

(60) Provisional application No. 62/380,825, filed on Aug. 29, 2016.

(51) Int. Cl.
| | |
|---|---|
| *H04B 1/12* | (2006.01) |
| *H03F 3/19* | (2006.01) |
| *H04B 1/44* | (2006.01) |
| *H03F 1/56* | (2006.01) |
| *H03F 3/21* | (2006.01) |
| *H03F 3/72* | (2006.01) |
| *H04B 1/10* | (2006.01) |
| *H03G 3/30* | (2006.01) |

(52) U.S. Cl.
CPC .............. *H04B 1/123* (2013.01); *H03F 1/56* (2013.01); *H03F 3/19* (2013.01); *H03F 3/211* (2013.01); *H03F 3/72* (2013.01); *H04B 1/44* (2013.01); *H03F 2200/111* (2013.01); *H03F 2200/165* (2013.01); *H03F 2200/171* (2013.01); *H03F 2200/294* (2013.01); *H03F 2200/387* (2013.01); *H03F 2200/411* (2013.01); *H03F 2200/451* (2013.01); *H03F 2203/21112* (2013.01); *H03F 2203/21145* (2013.01); *H03F 2203/21157* (2013.01); *H03F 2203/7209* (2013.01); *H03F 2203/7231* (2013.01); *H03F 2203/7239* (2013.01); *H03G 3/3042* (2013.01); *H03G 3/3052* (2013.01); *H04B 2001/1063* (2013.01)

(58) Field of Classification Search
CPC combination set(s) only.
See application file for complete search history.

(56) References Cited

U.S. PATENT DOCUMENTS

| | | | |
|---|---|---|---|
| 6,498,926 B1 * | 12/2002 | Ciccarelli | H03F 1/0261 455/240.1 |
| 2003/0073423 A1 * | 4/2003 | Cho | H04B 1/109 455/324 |

(Continued)

*Primary Examiner* — Junpeng Chen
(74) *Attorney, Agent, or Firm* — Chang & Hale LLP

(57) ABSTRACT

Filtering architectures and methods for wireless applications. In some embodiments, a wireless architecture can include a pre-amplifier filter configured to filter a signal, and an amplifier assembly configured to amplify the filtered signal. The wireless architecture can further include a filter circuit configured to provide selective filtering of the amplified signal based at least in part on a rejection level of the pre-amplifier filter and a gain of the amplifier assembly. In some embodiments, such a wireless architecture can be implemented in a packaged module or a wireless device.

17 Claims, 14 Drawing Sheets

(56) References Cited

U.S. PATENT DOCUMENTS

| | | | |
|---|---|---|---|
| 2003/0081694 A1* | 5/2003 | Wieck | H03G 1/0088 375/316 |
| 2009/0170456 A1* | 7/2009 | Kuo | H04B 1/0053 455/150.1 |
| 2010/0244944 A1* | 9/2010 | Herzinger | H03J 3/20 327/553 |
| 2011/0211649 A1* | 9/2011 | Hahn | H04B 1/525 375/285 |
| 2015/0214985 A1* | 7/2015 | Lee | H04B 1/0053 455/77 |
| 2015/0295607 A1* | 10/2015 | Liu | H04B 1/0007 370/280 |
| 2016/0112072 A1* | 4/2016 | Bauder | H04B 1/0057 370/297 |
| 2016/0126990 A1* | 5/2016 | Leipold | H04W 72/04 370/329 |

\* cited by examiner

FILTERING ARCHITECTURES AND METHODS FOR WIRELESS APPLICATIONS

CROSS-REFERENCE TO RELATED APPLICATION(S)

This application claims priority to U.S. Provisional Application No. 62/380,825 filed Aug. 29, 2016, entitled FILTERING ARCHITECTURES AND METHODS FOR WIRELESS APPLICATIONS, the disclosure of which is hereby expressly incorporated by reference herein in its respective entirety.

BACKGROUND

Field

The present disclosure relates to filtering architectures and methods for wireless applications.

Description of the Related Art

In wireless applications, a filter is utilized to selectively pass one or more portions of a signal. Such a passed portion of the signal can include a particular frequency or a frequency band. Examples of such filters can include a low-pass filter, a high-pass filter, a band-pass filter, a notch filter, etc.

SUMMARY

In accordance with some implementations, the present disclosure relates to a wireless architecture that includes a pre-amplifier filter configured to filter a signal, and an amplifier assembly configured to amplify the filtered signal. The wireless architecture further includes a filter circuit configured to provide selective filtering of the amplified signal based at least in part on a rejection level of the pre-amplifier filter and a gain of the amplifier assembly.

In some embodiments, the signal can be a received signal, and the amplifier assembly can include a low-noise amplifier. In some embodiments, the wireless architecture can further include an antenna node implemented between the pre-amplifier filter and an antenna. The antenna can be, for example, a diversity antenna.

In some embodiments, the pre-amplifier filter can be a band-pass filter. The rejection level of the pre-amplifier band-pass filter can have an absolute value of approximately G1, and the gain of the amplifier assembly can have an absolute value of approximately G2. The filter circuit can include a band-pass filter having a pass-band that is substantially the same as a pass-band of the pre-amplifier band-pass filter, and a rejection level with an absolute value of a difference between G2 and G1.

In some embodiments, the filter circuit can include a notch filter configured to further reject a selected out-of-band portion of the amplified signal. The selected out-of-band portion of the amplified signal can include some or all of a transmit signal at its frequency band.

In some embodiments, the filter circuit can include a tunable filter configured to further reject a selected out-of-band portion of the amplified signal. The selected out-of-band portion of the amplified signal can include some or all of a transmit signal at its frequency band.

In some embodiments, the filter circuit can be configured to provide filtering when in a first state and no filtering when in a second state. The filter circuit can include an electrically parallel arrangement of a filtered path and a bypass path, implemented between a node associated with the amplifier assembly and a transceiver node, such that the amplified signal is routed through the filtered path or the bypass path. The filter circuit can further include a switch implemented between the transceiver node and the parallel arrangement of the filtered path and the bypass path, with the switch being configured to allow routing of the amplified signal through the filtered path or the bypass path. The filtered path can include a filter such as a band-pass filter having a pass-band that is substantially the same as a pass-band of the pre-amplifier band-pass filter, or a notch filter configured to further reject a selected out-of-band portion of the amplified signal. The selected out-of-band portion of the amplified signal can include some or all of a transmit signal at its frequency band.

In some embodiments, the switch can include a pole connected to the transceiver node, a first throw connected to the filter of the filtered path, and a second throw connected to the bypass path. The node associated with the amplifier assembly can be an output node of the low-noise amplifier. The filter circuit can further include a switch implemented between the output node of the low-noise amplifier and the parallel arrangement of the filtered path and the bypass path, with the switch including a pole connected to the output node of the low-noise amplifier, a first throw connected to the filter of the filtered path, and a second throw connected to the bypass path. The first state of the filter circuit can include a frequency-division duplexing mode in which a transmit signal is present relative to the antenna node. The second state of the filter circuit can include a time-division duplexing mode in which a transmit signal is absent relative to the antenna node at a time when the low-noise amplifier is in operation.

In some embodiments, the low-noise amplifier of the amplifier assembly can include a first amplification stage and a second amplification stage arranged in series with an inter-stage node between the first and second amplification stages. The bypass path can be connected to the inter-stage node, such that when the filtered circuit is in the first state, the amplified signal includes amplification by both of the first and second amplification stages, and when the filtered circuit is in the second state, the amplified signal includes amplification by the first amplification stage.

In some embodiments, the low-noise amplifier can be configured to provide a plurality of values as the gain for the amplified signal. The low-noise amplifier can be configured as a variable-gain amplifier capable of providing the plurality of gain values. The filter circuit can be configured to provide different levels of filtering for the plurality of gain values of the low-noise amplifier.

In some embodiments, the filter circuit can be configured to provide different levels of filtering. In some embodiments, the wireless architecture can further include a transceiver in communication with the filter circuit, and the transceiver can be configured to process the amplified signal with a first level of filtering provided by the filter circuit. In some embodiments, the wireless architecture can further include another transceiver in communication with the filter circuit, and the other transceiver can be configured to process the amplified signal with a second level of filtering provided by the filter circuit. The different levels of filtering can include substantially nil filtering.

In some embodiments, the wireless architecture can further include a control system implemented to provide control for operation of some or all of the low-noise amplifier and the filter circuit. The control system can include a detector implemented to detect a condition and generate a signal for changing the filtering level of the filter circuit. In some embodiments, the control system can further include a Mobile Industry Processor Interface controller configured to generate a control signal based on the signal provided by the detector.

In a number of implementations, the present disclosure relates to a packaged module for processing a signal. The packaged module includes a packaging substrate configured to receive a plurality of components, and a receive architecture implemented on the packaging substrate. The receive architecture includes a pre-amplifier filter configured to filter the signal, an amplifier assembly configured to amplify the filtered signal, and a filter circuit configured to provide selective filtering of the amplified signal based at least in part on a rejection level of the pre-amplifier filter and a gain of the amplifier assembly.

In some embodiments, the amplifier assembly can include a low-noise amplifier configured to amplify the signal from an antenna. In some embodiments, the packaged module can be a diversity receive module, and the antenna can be a diversity antenna. The low-noise amplifier can be configured to provide a plurality of values as the gain for the amplified signal. The filter circuit can be configured to provide different levels of filtering for the plurality of gain values of the low-noise amplifier.

In some teachings, the present disclosure relates to a method for processing a signal. The method includes filtering the signal prior to amplification, amplifying the filtered signal, and selectively filtering the amplified signal based at least in part on a rejection level of the pre-amplification filtering and a gain of the amplification.

In some embodiments, the filtering can include band-pass filtering of the signal from an antenna. The amplifying can include amplifying the filtered signal with a low-noise amplifier. The amplifying with the low-noise amplifier can include operating the low-noise amplifier to provide one of a plurality of values as the gain for the amplified signal. The selective filtering of the amplified signal can include operating a filter circuit to provide different levels of filtering for the plurality of gain values of the low-noise amplifier.

According to a number of implementations, the present disclosure relates to a wireless device that includes an antenna configured to receive a signal, and a receive architecture in communication with the antenna and including a pre-amplifier filter configured to filter the signal, an amplifier assembly configured to amplify the filtered signal, and a filter circuit configured to provide selective filtering of the amplified signal based at least in part on a rejection level of the pre-amplifier filter and a gain of the amplifier assembly. The wireless device further includes a transceiver in communication with the filter circuit and configured to process the selectively filtered signal.

In some embodiments, the wireless device can be a cellular phone configured to operate in one or more cellular bands.

For purposes of summarizing the disclosure, certain aspects, advantages and novel features of the inventions have been described herein. It is to be understood that not necessarily all such advantages may be achieved in accordance with any particular embodiment of the invention. Thus, the invention may be embodied or carried out in a manner that achieves or optimizes one advantage or group of advantages as taught herein without necessarily achieving other advantages as may be taught or suggested herein.

DETAILED DESCRIPTION OF SOME EMBODIMENTS

The headings provided herein, if any, are for convenience only and do not necessarily affect the scope or meaning of the claimed invention.

Figure 1:
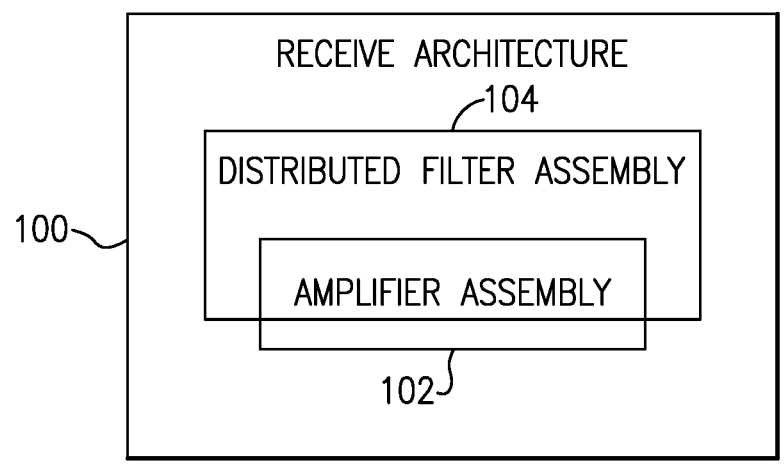
FIG. 1 depicts a receive (Rx) architecture having an amplifier assembly and a distributed filter assembly implemented relative to the amplifier assembly.

FIG. 1 depicts a receive (Rx) architecture 100 having an amplifier assembly 102 and a distributed filter assembly 104 implemented relative to the amplifier assembly 102. In some embodiments, the amplifier assembly 102 can include one or more amplifiers such as low-noise amplifiers (LNAs). Although various examples are described herein in the context of LNAs, it will be understood that one or more features of the present disclosure can also be implemented with other types of amplifiers, including amplifiers configured to amplify radio-frequency (RF) signals.

In some embodiments, the distributed filter assembly 104 can include a first filter (e.g., a band-pass filter) implemented before a given LNA, and a second filter (e.g., a band-pass filter) implemented after the LNA. Such pre-LNA and post-LNA filters can be configured along with the LNA to provide a number of advantageous features. Examples related to such distributed filter assembly and the amplifier assembly are described herein in greater detail.

It is noted that an Rx architecture is desirably designed to extract a very small signal from a noisy environment that usually contains signals that may be several order of magnitude larger than the signal of interest. For example, in a frequency-division duplexing (FDD) system such as in a FDD wireless cellular Long Term Evolution (LTE) system, a transmit (Tx) signal can be very strong at or close to an Rx input. In addition, signals such as wireless local area network (WLAN) signals may also be present.

Typical Rx architectures include multiple stages of passive and active components. Actives stages can include LNAs, and performance of such active stages can suffer in the presence of large interfere signals such as Tx and/or WLAN signals.

Typically, the first active stage in an Rx architecture is an LNA for amplifying a relatively small signal of interest. In some situations, however, such an LNA may not be the limiting factor in terms of the Rx architecture's ability to handle large interfere signals. For example, the foregoing LNA may be followed by a second amplifier or a mixer as a second active stage; and such a second active stage may see a larger interfere signal than the LNA stage because the interfere signal may also be amplified by the LNA. Thus, level of interfere signal suppression can be driven by the second stage. In other words, the LNA as the first active stage may need less large signal suppression than the second active stage.

Figure 2:
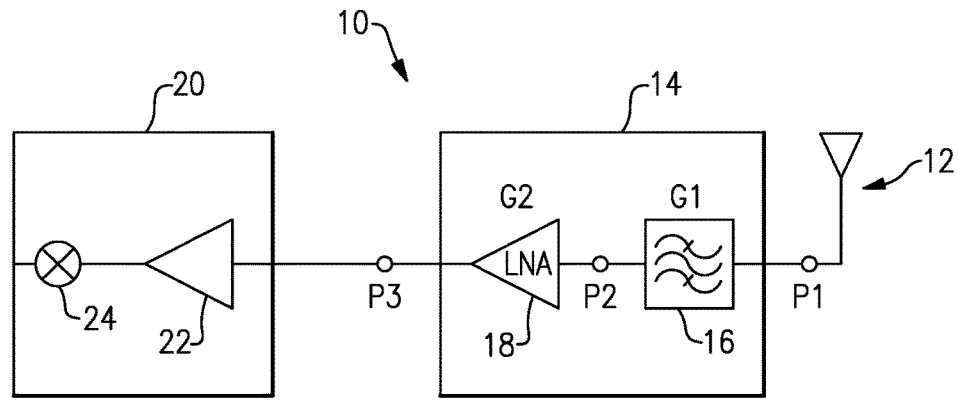
FIG. 2 depicts a typical Rx architecture.

FIG. 2 depicts a typical Rx architecture 10 having features as in the foregoing example. In such an architecture, a single filter 16 (e.g., a band-pass filter) implemented prior to an LNA 18 is utilized to attenuate a strong interfere signal such as a Tx and/or a WLAN signal (e.g., for a cellular LTE receiver). Such a filter can be lossy, and thus reduces not only the interfere signal, but also the signal of interest (and as a result, a signal quality such as signal-to-noise-ratio (SNR)).

In the example of FIG. 2, the single filter 16 is shown to be implemented between the LNA 18 and an antenna 12 such as a diversity antenna. In some embodiments, the filter 16 and the LNA 18 can be implemented in a device such as a module 14 close to the antenna 12.

In some embodiments, an output of the LNA 18 can be in communication with a receiver circuit 20 (e.g., implemented in a transceiver). Such a receiver circuit can include, for example, an amplifier 22 and/or a mixer 24.

For the purpose of description, a signal received by the antenna 12 can have a power level of P1 at a node between the antenna 12 and the filter 16. A filtered signal can have a power level of P2 at a node between the filter 16 and the LNA 18. An amplified signal can have a power level of P3 at an output of the LNA 18. Also for the purpose of description, the filter 16 is shown to have a gain/loss of G1. The LNA 18 is shown to have a gain/loss of G2.

In some implementations, the present disclosure relates to a receive architecture having distributed filtering functionality to achieve one or more desirable features. In some embodiments, such distributed filtering functionality can include filtering before and after an LNA. Each filter can be designed to provide an adequate attenuation level for a corresponding stage in a receive path, and a plurality of such cascaded filtering can maintain performance under challenging conditions such as a large interfere signal condition.

Figure 3:
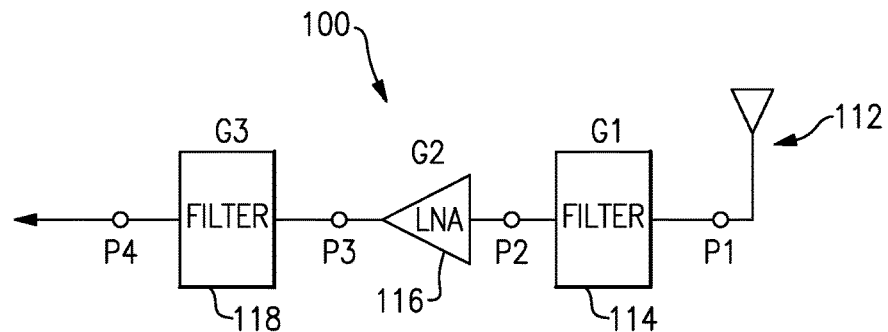
FIG. 3 depicts a receive architecture that can provide a distributed filtering functionality.

FIG. 3 depicts a receive architecture 100 that can provide the foregoing distributed filtering functionality. In some embodiments, such a receive architecture can be implemented close to an antenna 112 such as a diversity antenna. Although various examples are described herein in the context of diversity receive operations, it will be understood that one or more features of the present disclosure can also be implemented in other types of receive applications. Further, it will also be understood that one or more features of the present disclosure can also be implemented in other types of amplification and filtering applications, including transmit applications, combined transmit/receive applications, etc.

In the example of FIG. 3, the receive architecture 100 is shown to include a first filter 114 implemented close to the antenna 112, followed by an LNA 116. A second filter 118 is shown to be implemented on the output side of the LNA 116. The output of the second filter 118 can be routed to, for example, a transceiver circuit.

For the purpose of description, a signal received by the antenna 112 can have a power level of P1 at a node between the antenna 112 and the first filter 114. A filtered signal can have a power level of P2 at a node between the first filter 114 and the LNA 116. An amplified signal can have a power level of P3 at a node between the LNA 116 and the second filter 118. A second-filtered signal can have power level of P4 at a node after the second filter 118.

For the purpose of description, the first filter 114 is shown to have a gain/loss of G1. The LNA 116 is shown to have a gain/loss of G2. The second filter 118 is shown to have a gain/loss of G3.

In some embodiments, the first filter 114 in the example of FIG. 3 can be configured to provide less attenuation than, for example, the single filter 16 of FIG. 2. Such a reduced attenuation by the first filter 114 can result in a lower loss or less attenuation of the signal of interest. The second filter 118 can be configured to provide additional rejection of one or more out-of-band components, including, for example, large interfere signal component(s) associated with transmission signal(s).

For example, suppose that a power level of approximately 0 dBm is present at the antenna (P1=0 dBm in FIG. 2, P1=0 dBm in FIG. 3), and approximately the same power level is desired as an input to the transceiver (P3=0 dBm in FIG. 2, P4=0 dBm in FIG. 3). Suppose further that approximately 20 dB attenuation is desired to reject a large interfere signal.

In the example of FIG. 2, the filter 16 can provide 20 dB of attenuation, and the LNA 18 can provide a gain of 20 dB so as to result in the 0 dBm power level (P3) at the input to the transceiver.

In the example of FIG. 3, the first and second filters 114, 118 can collectively provide 20 dB of attenuation, and the LNA 116 can provide a gain of 20 dB so as to result in the 0 dBm power level (P4) at the input to the transceiver. Among the first and second filters 114, 118, the amounts of attenuation can be distributed to achieve a desired performance. For example, each of the first and second filters 114, 118 can provide 10 dB of attenuation. As described herein, such a distribution of filtering can result in a reduction of noise figure in the signal being provided to the transceiver; thus, a corresponding increase in signal-to-noise ratio can be achieved.

Figure 4:
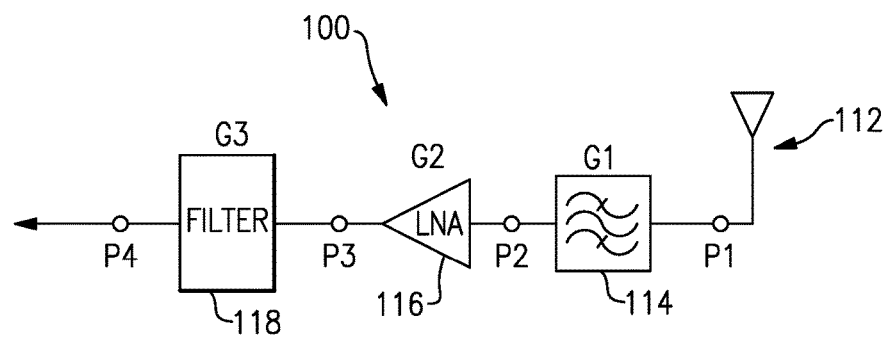
FIG. 4 shows a receive architecture that can be a more specific example of the receive architecture of FIG. 3.

FIG. 4 shows a receive architecture 100 that can be a more specific example of the receive architecture 100 of FIG. 3. In the example of FIG. 4, the receive architecture 100 is shown to include a band-pass filter 114 as the first filter 114 of FIG. 3. Such a band-pass filter can be configured to pass a signal in a frequency band Bx and reject a signal outside of the band Bx.

In some embodiments, the second filter 118 of FIG. 4 can be another band-pass filter. In such a configuration, the second band-pass filter (118) can be configured to pass a signal in the band Bx and reject a signal outside of the band Bx to provide additional filtering as described herein.

In some embodiments, the second filter 118 of FIG. 4 can be, for example, a notch filter. In such a configuration, the notch filter (118) can be configured to pass the Bx-band signal being processed, and reject a specific band (By) signal outside of the Bx-band. Such a By-band signal being notch-filtered can be, for example, a transmit signal associated with the Bx-band receive signal in a frequency-division duplexing (FDD) operation. It will be understood that Bx and By can be, for example, receive and transmit portions of the same cellular band or different cellular bands.

Figure 5:
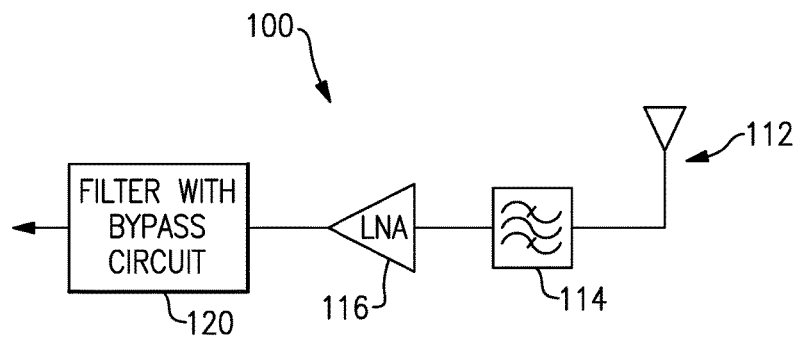
FIG. 5 shows that in some embodiments, a receive architecture can include a bypass functionality for at least one of a plurality of distributed filters.

FIG. 5 shows that in some embodiments, a receive architecture 100 can include a bypass functionality for at least one of a plurality of distributed filters. In the example of FIG. 5, the receive architecture 100 is shown to include an antenna 112, a first filter 114 implemented as a band-pass filter, and an LNA 116, similar to the example of FIG. 4. The receive architecture 100 is shown to further include an assembly 120 having a filter with a bypass circuit, and such an assembly can be implemented on the output side of the LNA 116.

Although described in the foregoing example context, it will be understood that other configurations involving a filter/bypass-circuit assembly can also be implemented. For example, the first filter (114) can be a filter other than a band-pass filter. In another example, a filter/bypass-circuit assembly can be implemented for a pre-LNA filter (e.g., associated with the first filter 114), or for each of the pre-LNA and post-LNA filters.

Figure 6:
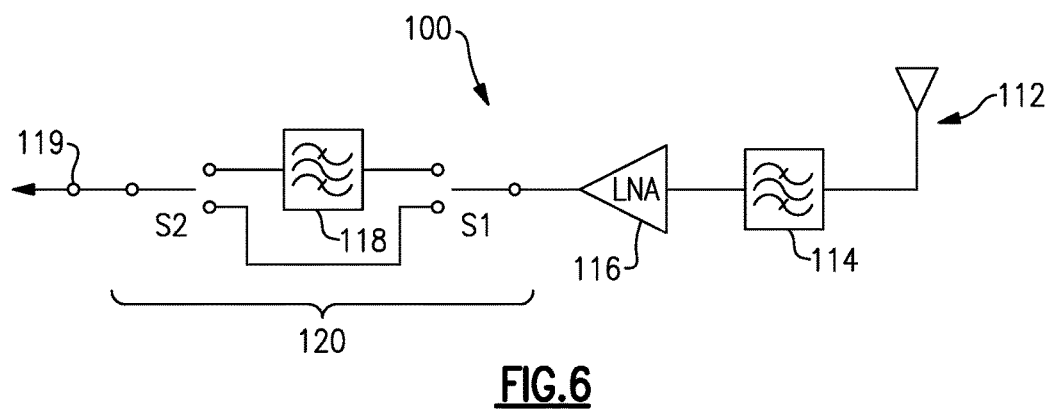
FIG. 6 shows a receive architecture that can be a more specific example of the receive architecture of FIG. 5.
Figure 7:
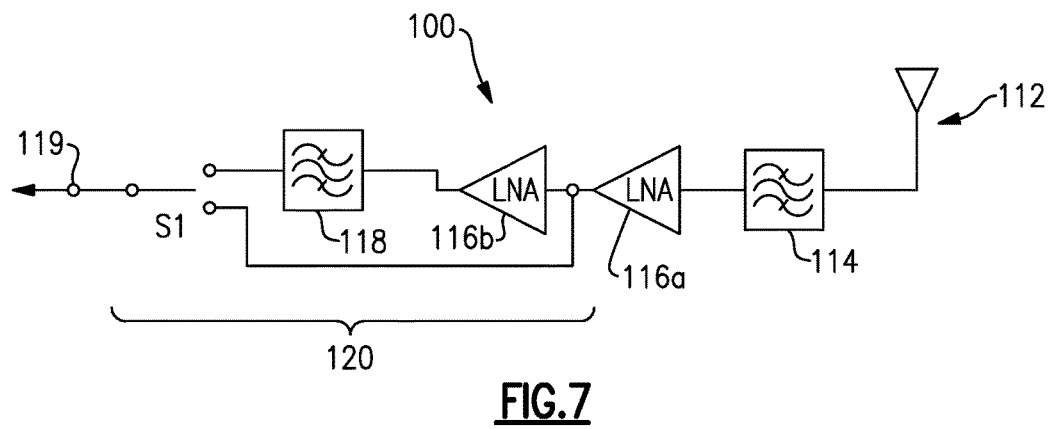
FIG. 7 shows a receive architecture where an LNA can include a first stage and a second stage, and a filter/bypass-circuit assembly can be implemented to include at least a portion of such amplification stages.

FIGS. 6 and 7 show examples of how the filter/bypass-circuit assembly 120 of FIG. 5 can be implemented. FIG. 6 shows a receive architecture 100 having an antenna 112 and a first filter 114 implemented as a band-pass filter, similar to the example of FIG. 5. In the example of FIG. 6, an LNA 116 can be a single-stage amplifier, and a filter/bypass-circuit assembly 120 can be implemented on the output side of such an LNA.

The filter/bypass-circuit assembly 120 in the example of FIG. 6 is shown to include a switch S1 having a node coupled to the output of the LNA 116. Other nodes of the switch S1 can be coupled to a parallel combination of a second filter 118 (e.g., a band-pass filter) and a bypass path, such that the output of the LNA 116 can be connected to the second filter 118 or the bypass path. On the other side of the parallel combination of the second filter 118 and the bypass path, a switch S2 is shown to be provided, with a node 119 that can be coupled to a transceiver and other nodes coupled to the second filter 118 and the bypass path.

Accordingly, the switches S1 and S2 can operate to route a signal through the second filter 118 or the bypass path. For example, if S1 is configured as a single-pole-double-throw (SPDT) switch, the pole of S1 can be connected to the output of the LNA 116, the first throw of S1 can be connected to the second filter 118, and the second throw of S1 can be connected to the bypass path. Similarly, if S2 is configured as a SPDT switch, the pole of S2 can be connected to the transceiver node 119, the first throw of S2 can be connected to the second filter 118, and the second throw of S2 can be connected to the bypass path. Configured in the foregoing example manner, the signal can be routed through the second filter 118 by connecting the pole and the first throw in S1, and connecting the pole and the first throw in S2. Similarly, the signal can be made to bypass the second filter 118 and be routed through the bypass path by connecting the pole and the second throw in S1, and connecting the pole and the second throw in S2. Additional examples concerning the foregoing signal-routing functionality are described herein in greater detail.

It will be understood that the switches S1 and S2 in the example of FIG. 6 can be configured in a number of ways, including the example SPDT configuration, to achieve the foregoing signal-routing functionality.

FIG. 7 shows a receive architecture 100 having an antenna 112 and a first filter 114 implemented as a band-pass filter, similar to the example of FIG. 5. In the example of FIG. 7, an LNA 116 can include a first stage 116a and a second stage 116b, and a filter/bypass-circuit assembly 120 can be implemented to include at least a portion of such amplification stages.

The filter/bypass-circuit assembly 120 in the example of FIG. 7 is shown to include a first signal path that includes a first-stage-amplified signal (from the first stage 116a) being further amplified by the second stage 116b, followed by a second filter 118 (e.g., a band-pass filter). A second signal path can be provided from the output of the first stage 116a, and such a second signal path can bypass the second stage 116b and the second filter 118.

To accommodate the foregoing filter/bypass functionality, a switch S1 can be implemented to include a node that can be coupled to a transceiver and other nodes coupled to the output of second filter 118 and the second path (and thus the output of the first stage 116a). Accordingly, the switch S1 can operate to route a signal through the second stage 116b and the second filter 118 (of the first signal path) or the second signal path bypassing the second stage 116b and the second filter 118. For example, if S1 is configured as a SPDT switch, the pole of S1 can be connected to the transceiver node 119, the first throw of S1 can be connected to the second filter 118, and the second throw of S2 can be connected to the bypass path. Additional examples concerning the foregoing signal-routing functionality are described herein in greater detail.

It will be understood that the switch S1 in the example of FIG. 7 can be configured in a number of ways, including the example SPDT configuration, to achieve the foregoing signal-routing functionality.

Figure 8A:
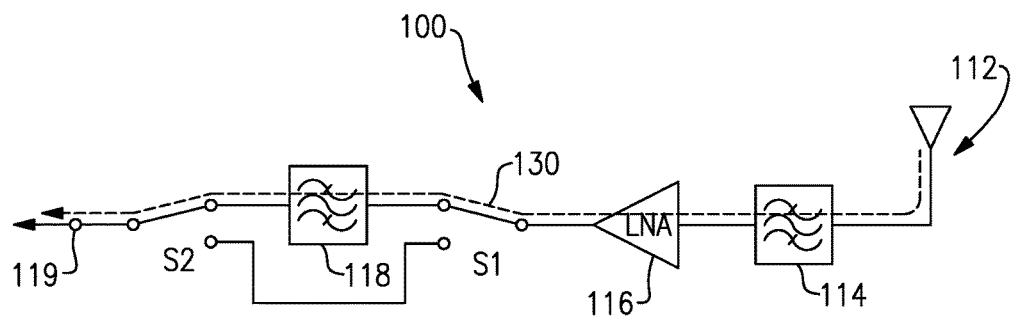
FIG. 8A shows the receive architecture of FIG. 6 in a first state where the LNA-amplified signal is routed through the second filter.
Figure 8B:
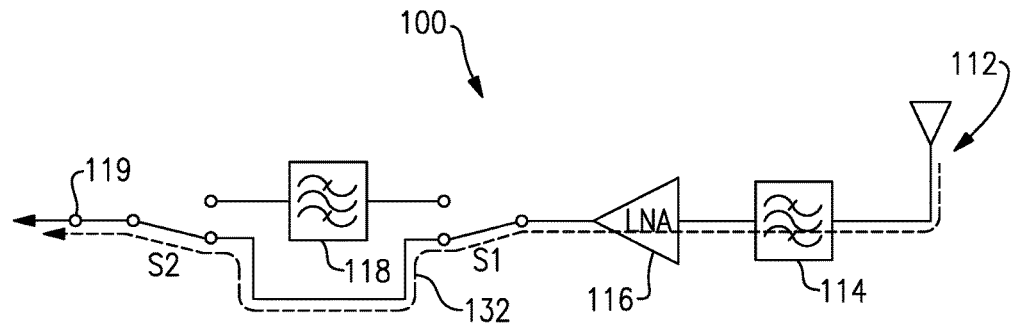
FIG. 8B shows the receive architecture of FIG. 6 in a second state where the LNA-amplified signal bypasses the second filter.

FIGS. 8A and 8B show the receive architecture 100 of FIG. 6 in a first state where the LNA-amplified signal is routed through the second filter 118 (FIG. 8A), and a second state where the LNA-amplified signal bypasses the second filter 118 (FIG. 8B).

More particularly, in FIG. 8A, the first switch S1 is operated so that its pole (which is connected to the output of the LNA 116) is connected to the first throw (which is connected to the second filter 118), and the second switch S2 is operated so that its pole (which is connected to the transceiver node 119) is connected to the first throw (which is connected to the second filter 118). Accordingly, a signal path indicated as 130, including the first and second filters 114, 118, is provided between the antenna 112 and the transceiver node 119.

In FIG. 8B, the first switch S1 is operated so that its pole (which is connected to the output of the LNA 116) is connected to the second throw (which is connected to the bypass path), and the second switch S2 is operated so that its pole (which is connected to the transceiver node 119) is connected to the second throw (which is connected to the bypass path). Accordingly, a signal path indicated as 132, including the first filter 114 but bypassing the second filter 118, is provided between the antenna 112 and the transceiver node 119.

In some embodiments, the example receive architecture 100 of FIGS. 6 and 8 can be utilized in a wireless system capable of operating in both frequency-division duplexing (FDD) and time-division duplexing (TDD) modes. When in the FDD mode, a Tx interfere signal is typically present, and filtering by both of the first and second filters (114, 118) as in FIG. 8A can be implemented. When in the TDD mode, a Tx interfere signal is typically not present at the same time as an Rx portion of the duplexing operation; thus use of the second filter (118) may not be needed or desired. Accordingly, the bypass configuration of FIG. 8B can be implemented.

Figure 9A:
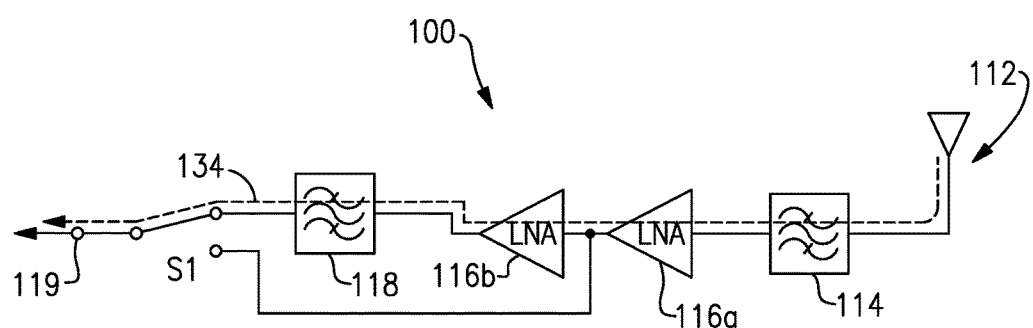
FIG. 9A shows the receive architecture of FIG. 7 in a first state where the first-stage-amplified signal is routed through the second stage and the second filter.
Figure 9B:
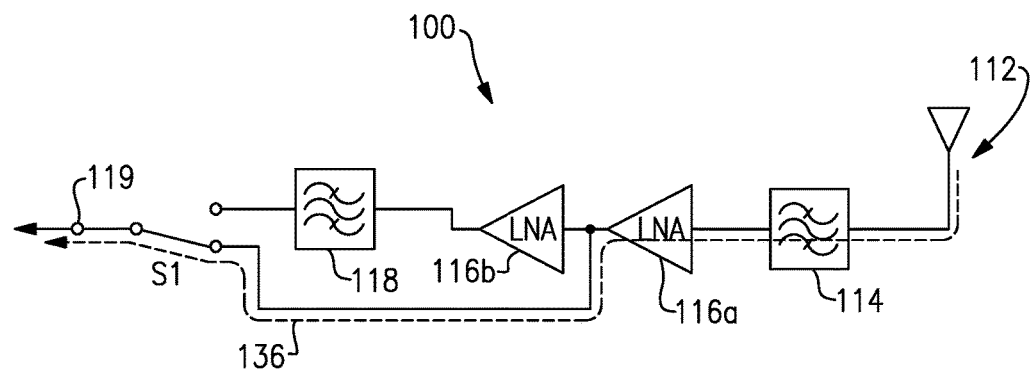
FIG. 9B shows the receive architecture of FIG. 7 in a second state where the first-stage-amplified signal bypasses the second stage and the second filter.

FIGS. 9A and 9B show the receive architecture 100 of FIG. 7 in a first state where the first-stage-amplified signal (from the first stage 116a) is routed through the second stage 116b and the second filter 118 (FIG. 9A), and a second state where the first-stage-amplified signal (from the first stage 116a) bypasses the second stage 116b and the second filter 118 (FIG. 9B).

More particularly, in FIG. 9A, the switch S1 is operated so that its pole (which is connected to the transceiver node 119) is connected to the first throw (which is connected to the second filter 118). Accordingly, a signal path indicated as 134, including the first and second stages 116a, 116b and the first and second filters 114, 118, is provided between the antenna 112 and the transceiver node 119.

In FIG. 9B, the switch S1 is operated so that its pole (which is connected to the transceiver node 119) is connected to the second throw (which is connected to output of the first stage 116a through the bypass path). Accordingly, a signal path indicated as 136, including the first filter 114 and the first stage 116 but bypassing second stage 116b and the second filter 118, is provided between the antenna 112 and the transceiver node 119.

In some embodiments, the example receive architecture 100 of FIGS. 7 and 9 can be utilized in a wireless system where an amount of filtering is adjustable based on an amount of amplification. Thus, as in the example of FIG. 9A, a greater amount of amplification (e.g., by both of the two stages 116a, 116b) can be accommodated by an additional filtering by the second filter 118. When a lesser amount of amplification is implemented as in the example of FIG. 9B, lesser amount of filtering can be provided by bypassing the second filter 118.

In the examples of FIGS. 6-9, it is assumed that a transceiver node 119 at the end of each of the shown receive paths is connected or connectable to a transceiver. For example, in each of the two operating modes of FIGS. 8A and 8B, the respective signal (e.g., in path 130 or 132) is assumed to be routed from the transceiver node 119 to a common transceiver. Similarly, in each of the two operating modes of FIGS. 9A and 9B, the respective signal (e.g., in path 134 or 136) is assumed to be routed from the transceiver node 119 to a common transceiver.

Figure 10:
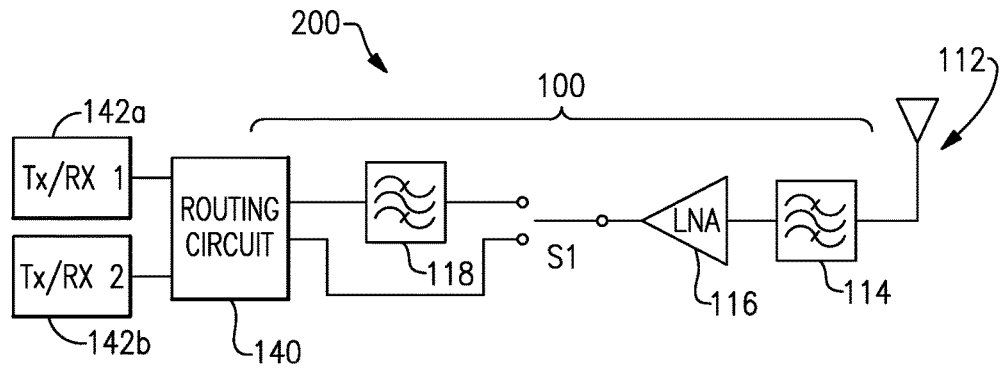
FIG. 10 shows a wireless architecture having a receive architecture similar to that of FIG. 6, but in which the two signal paths are connected or connectable to different transceivers.

In some applications, a wireless design may include different transceivers for different receive path configurations. For example, FIG. 10 shows a wireless architecture 200 having a receive architecture 100 similar to that of FIG. 6, but in which the two example signal paths are connected or connectable to different transceivers. In some embodiments, the wireless architecture 200 can include a routing circuit 140 configured to route signals associated with the second filter 118 and the bypass path to respective transceivers 142a, 142b. Such a routing circuit can include, for example, a switching circuit, various signal paths, etc. to provide routing functionalities.

Figure 11A:
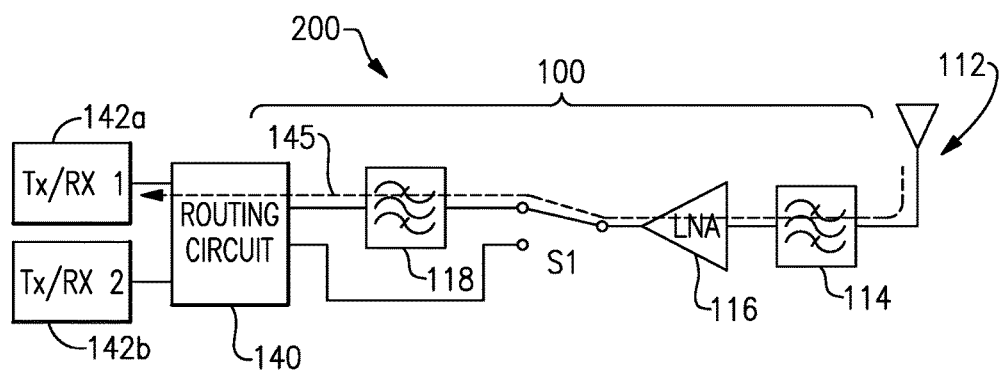
FIG. 11A shows the wireless architecture of FIG. 10 in a first state where the LNA-amplified signal is routed through the second filter.
Figure 11B:
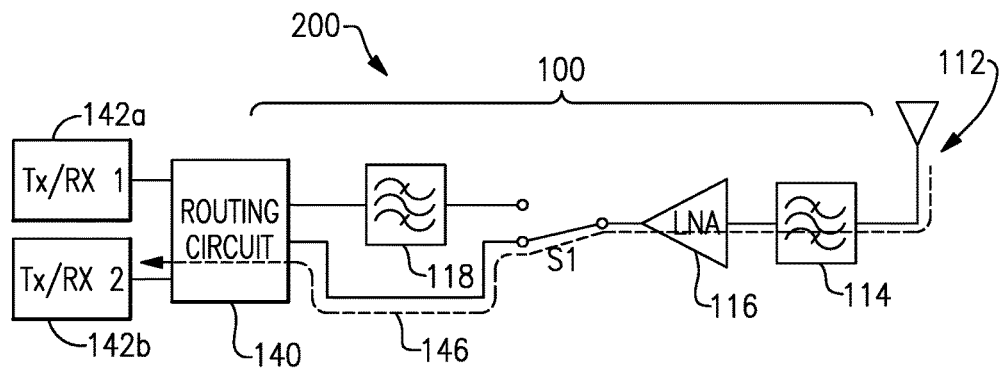
FIG. 11B shows the wireless architecture of FIG. 10 in a second state where the LNA-amplified signal bypasses the second filter.

FIGS. 11A and 11B show examples of signal routing for the wireless architecture of FIG. 10 for the two example receive modes of FIGS. 8A and 8B. More particularly, in FIG. 11A, a signal is shown to be twice-filtered as in FIG. 8A and be routed to the first transceiver 142a by the routing circuit 140. Accordingly, a signal path indicated as 145, including the first and second filters 114, 118, is provided between the antenna 112 and the first transceiver 142a.

In FIG. 11B, a signal is shown to be single-filtered as in FIG. 8B and be routed to the second transceiver 142b by the routing circuit 140. Accordingly, a signal path indicated as 146, including the first filter 114 but bypassing the second filter 118, is provided between the antenna 112 and the second transceiver 142b.

As described in reference to FIGS. 8A and 8B, the receive architecture 100 of FIGS. 6 and 8 can be utilized for FDD and TDD operations. Thus, in the example operating modes of FIGS. 11A and 11B, the first transceiver 142a can be configured to include FDD functionality, and the second transceiver 142b can be configured to include TDD functionality.

Figure 12:
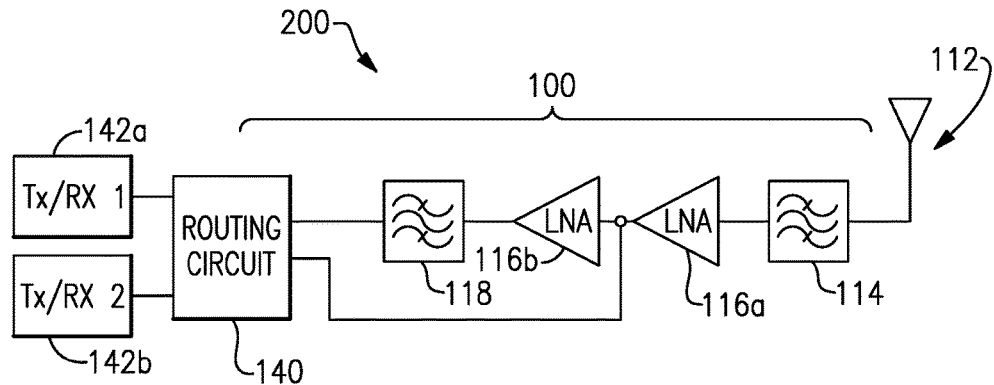
FIG. 12 shows a wireless architecture having a receive architecture similar to that of FIG. 7, but in which the two signal paths are connected or connectable to different transceivers.

In another example, FIG. 12 shows a wireless architecture 200 having a receive architecture 100 similar to that of FIG. 7, but in which the two example signal paths are connected or connectable to different transceivers. In some embodiments, the wireless architecture 200 can include a routing circuit 140 configured to route signals associated with the second filter 118 and the bypass path to respective transceivers 142a, 142b. Such a routing circuit can include, for example, a switching circuit, various signal paths, etc. to provide routing functionalities.

Figure 13A:
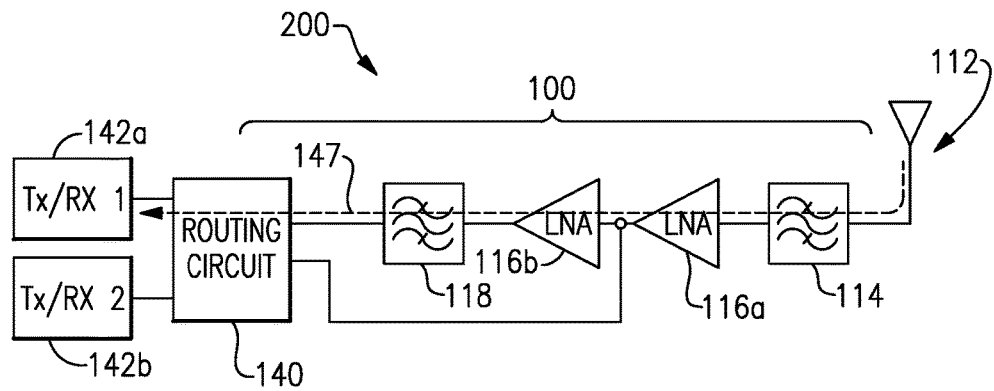
FIG. 13A shows the wireless architecture of FIG. 12 in a first state where the first-stage-amplified signal is routed through the second stage and the second filter.
Figure 13B:
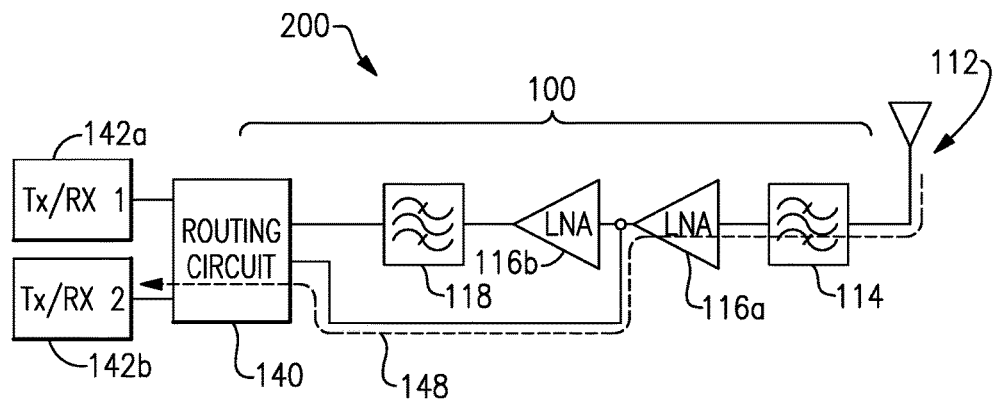
FIG. 13B shows the wireless architecture of FIG. 12 in a second state where the first-stage-amplified signal bypasses the second stage and the second filter.

FIGS. 13A and 13B show examples of signal routing for the wireless architecture of FIG. 12 for the two example receive modes of FIGS. 9A and 9B. More particularly, in FIG. 13A, a signal is shown to be twice-filtered (and amplified by both of the stages) as in FIG. 9A and be routed to the first transceiver 142a by the routing circuit 140. Accordingly, a signal path indicated as 147, including the first and second filters 114, 118 and the first and second stages 116a, 116b, is provided between the antenna 112 and the first transceiver 142a.

In FIG. 13B, a signal is shown to be single-filtered (and amplified only by the first stage) as in FIG. 9B and be routed to the second transceiver 142b by the routing circuit 140. Accordingly, a signal path indicated as 148, including the first filter 114 and the first stage 116a but bypassing second stage 116b and the second filter 118, is provided between the antenna 112 and the second transceiver 142b.

As described in reference to FIGS. 9A and 9B, the receive architecture 100 of FIGS. 7 and 9 can be utilized in applications where an amount of filtering is adjustable based on an amount of amplification. Thus, in the example operating modes of FIGS. 13A and 13B, the first transceiver 142a can be configured to process a signal that is amplified and filtered by greater amounts, and the second transceiver 142b can be configured to process a signal that is amplified and filtered by lesser amounts.

It is noted that a receive architecture having one or more features as described herein can provide versatility in how received signals are processed. In some applications, transceiver linearity can drive how much such signals are amplified and/or filtered. Thus, in the examples of FIGS. 10-13, the different transceivers can further tailor processing of the received signals to further improve performance parameters such as linearity.

Figure 14:
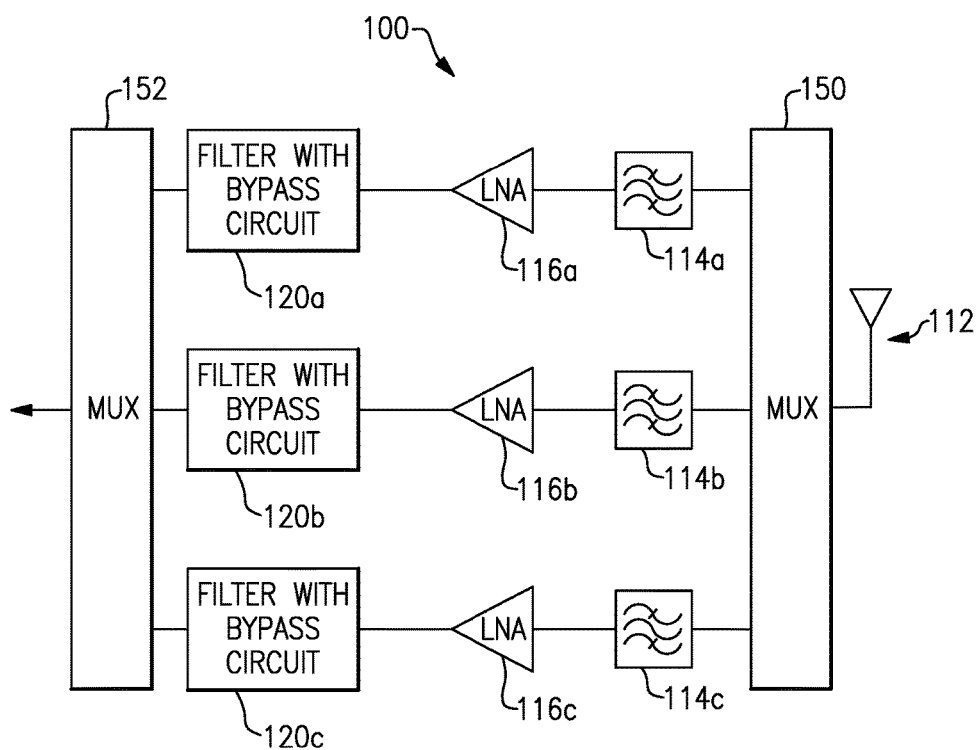
FIG. 14 shows that in some embodiments, a receive architecture can include a plurality of receive paths, where each receive path is similar to the example of FIG. 5.

FIG. 14 shows that in some embodiments, a receive architecture 100 can include a plurality of receive paths, where each receive path is similar to the example of FIG. 5. In the example of FIG. 14, three of such receive paths are shown, but other numbers of receive paths can also be implemented.

In the example of FIG. 14, a first receive path is shown to include a filter 114a, an LNA 116a, and an assembly 120a of a filter and a bypass circuit, similar to the example of FIG. 5. Similarly, a second receive path is shown to include a filter 114b, an LNA 116b, and an assembly 120b of a filter and a bypass circuit, similar to the example of FIG. 5. Similarly, a third receive path is shown to include a filter 114c, an LNA 116c, and an assembly 120c of a filter and a bypass circuit, similar to the example of FIG. 5.

In some embodiments, inputs of such receive paths can be coupled to a common antenna 112 through, for example, a multiplexing circuit 150. Further, outputs of such receive paths can be coupled to a common output through, for example, a multiplexing circuit 152. In some embodiments, some or all of the foregoing receive paths can be utilized to provide carrier-aggregation functionality.

In the example of FIG. 14, it will be understood that some or all of the receive paths can be configured to provide various functionalities, including variations such as selective routing of signals to a plurality of transceivers from a given receive path.

Figure 15:
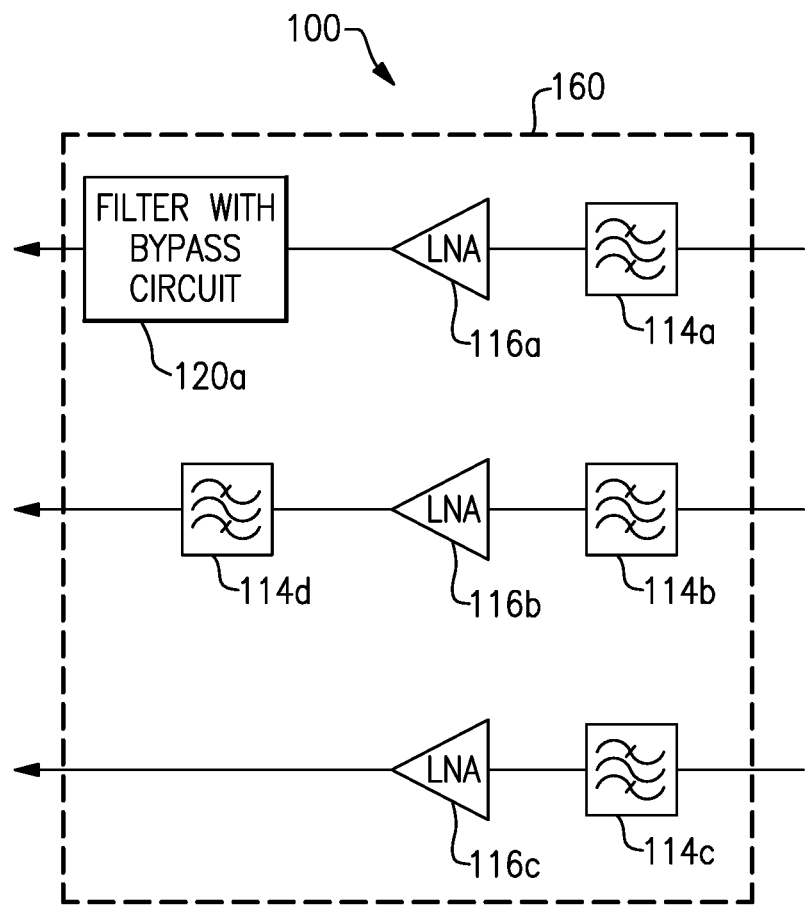
FIG. 15 shows that in some embodiments, a receive architecture can include a plurality of receive paths, and not all of such receive paths need to have a bypass-able filter functionality as described herein.

FIG. 15 shows that in some embodiments, a receive architecture 100 can include a plurality of receive paths, and not all of such receive paths need to have a bypass-able filter functionality as described herein. For example, an assembly 160 of receive paths can include one or more receive paths having a distributed filtering functionality. Such receive path(s) can include a receive path having a filter 114a, an LNA 116a, and an assembly 120a of a filter and a bypass circuit (similar to the example of FIG. 5), and/or a receive path having a first filter 114b, an LNA 116b, and a second filter 114d (with the filters 114b, 114d configured to provide distributed filtering as described herein). In some embodiments, the assembly 160 of receive paths can also include a conventional receive path having a filter 114c and an LNA 116c.

Figure 16:
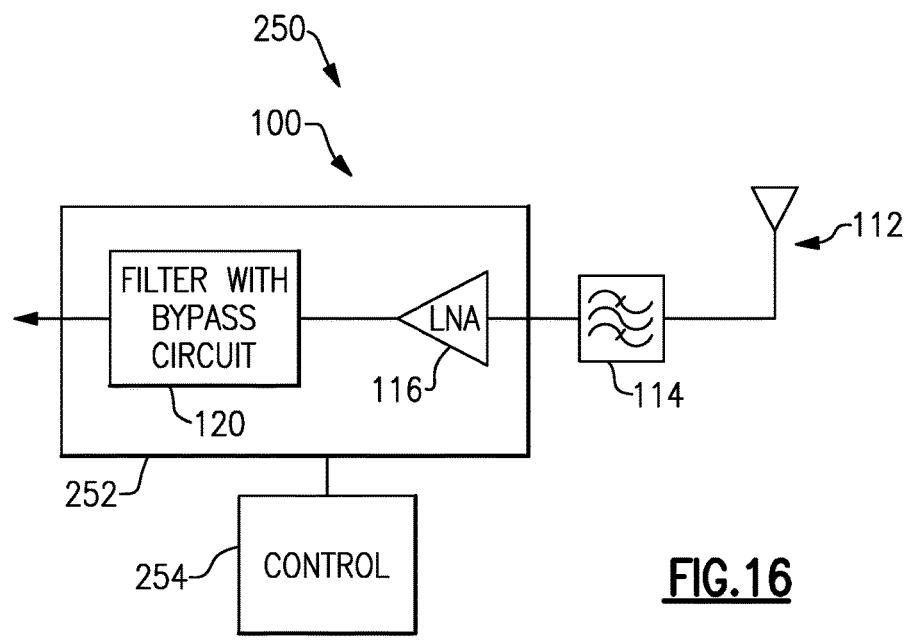
FIG. 16 shows that in some embodiments, a wireless system can include a receive architecture having one or more as described herein.

FIG. 16 shows that in some embodiments, a wireless system 250 can include a receive architecture 100 having one or more as described herein. Such a receive architecture can be similar to the example of FIG. 5, and some or all of such a receive architecture (e.g., a portion 252 including an LNA 116 and an assembly 120 of a filter and a bypass path) can be operated with a control component 254. Such control of the portion 252 can include, for example, control of operation of the LNA 116, and operation of one or more switches associated with the filter/bypass-path assembly 120.

Figure 17:
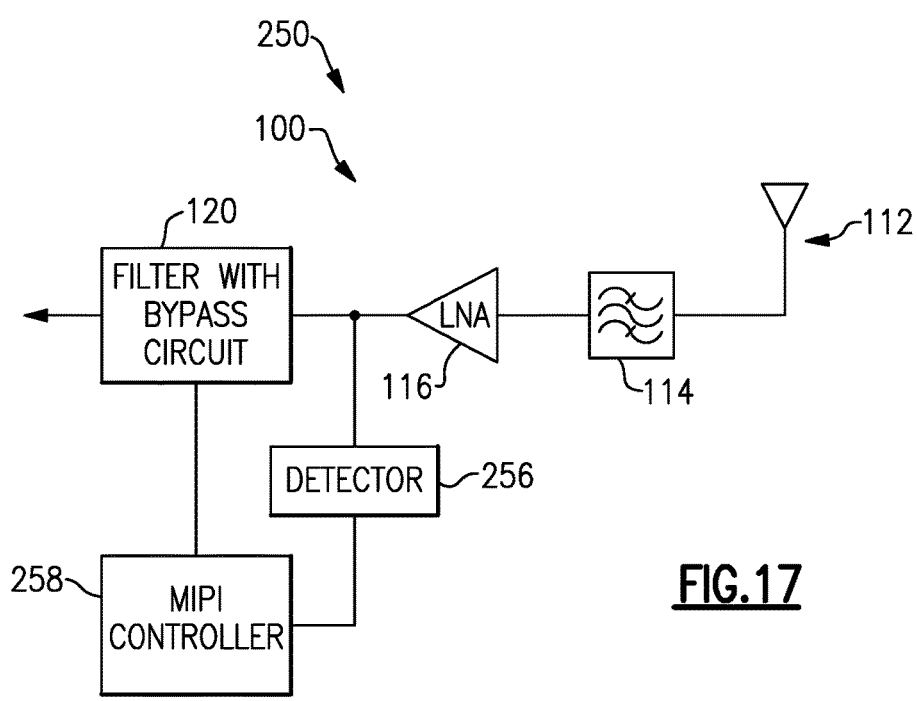
FIG. 17 shows a wireless system that can be a more specific example of the system of FIG. 16.

FIG. 17 shows a wireless system 250 that can be a more specific example of the system 250 of FIG. 16. In FIG. 17, a receive architecture 100 similar to the example of FIG. 16 can be provided. A detector 256 can be implemented to detect a condition; and based on such detection, the filter/bypass-path assembly 120 can be adjusted to accommodate the condition. In some embodiments, such an adjustment of the filter/bypass-path assembly 120 can be facilitated by a controller 258 such as a MIPI (Mobile Industry Processor Interface) controller.

For example, suppose that the receive architecture 100 of FIG. 17 is similar to that of FIG. 6. In such an architecture, the filter/bypass-path assembly 120 includes a second filter (118 in FIG. 6), a parallel bypass path, and switches S1 and S2, to thereby allow an LNA-amplified signal to be routed through the second filter or the bypass path. Referring to FIG. 17, the detector 256 can include a sensing circuit or element implemented along the receive path (e.g., at the output of the LNA 116) and configured to detect a condition such as a presence of a large amplitude interfere signal.

Upon detection of such a condition, a signal representative of the condition can be provided to the MIPI controller 258, which in turn can generate MIPI control signals for operating the switches of the filter/bypass-path assembly 120. In the example context of the detection of a large amplitude interfere signal, when such a condition is detected, the MIPI controller 258 can generate appropriate control signals to set the switches S1, S2 to route the LNA-amplified signal to the second filter (118). Similarly, when such a large amplitude interfere signal is absent, the MIPI controller 258 can generate appropriate control signals to set the switches S1, S2 to route the LNA-amplified signal to bypass the second filter (118).

Figure 18:
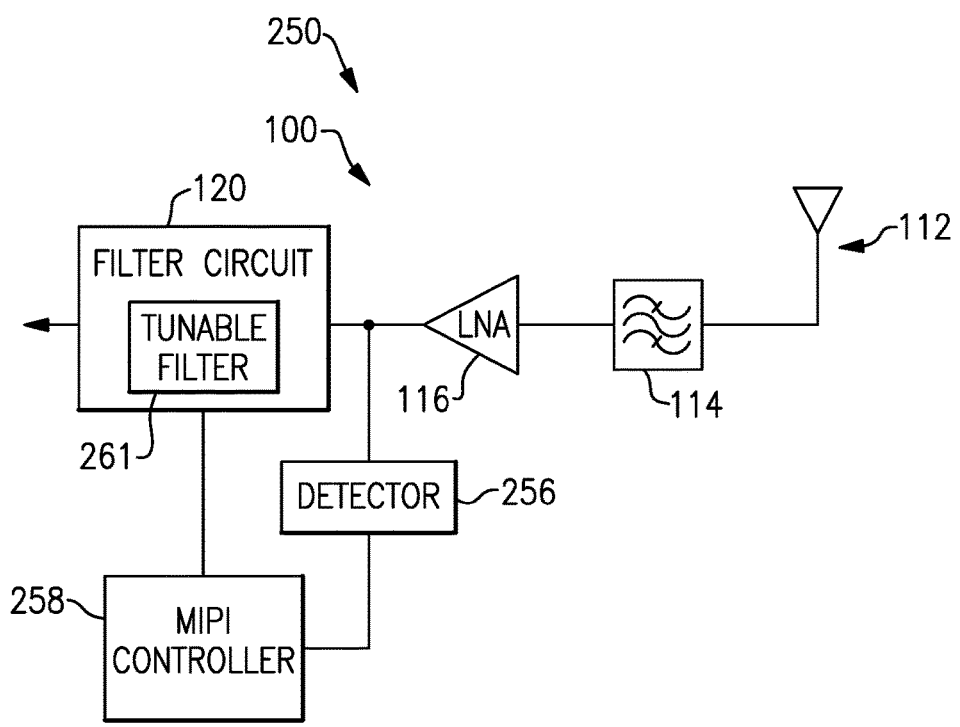
FIG. 18 shows a wireless system that can be another more specific example of the system of FIG. 16.

FIG. 18 shows a wireless system 250 that can be another more specific example of the system 250 of FIG. 16. In FIG. 18, a receive architecture 100 can include a filter 114 and an LNA 116 similar to the example of FIG. 16. In the example of FIG. 18, however, the receive architecture 100 can include a filter circuit 120 that includes a tunable filter 261.

In some embodiments, the tunable filter 261 can be configured to provide additional rejection of one or more out-of-band components, including, for example, large interfere signal component(s) associated with transmission signal(s). For example, suppose that the band-pass filter 114 in FIG. 18 passes band Bx, and a first out-of-band component is in band Bx1 and a second out-of-band component is in band Bx2. The tunable filter 261 can be configured to be in a first state for blocking the Bx1 band, or in a second state for blocking the Bx2 band. Assuming that such Bx1 and Bx2 bands are transmit bands, one can see that the tunable filter 261 allows the receive architecture 100 to operate more efficiently with different transmit bands.

In the example of FIG. 18, operation of the receive architecture 100, including setting of the tunable filter 261, can be facilitated by a control system described herein in reference to FIGS. 16 and 17. For example, a detector 256 can be implemented to detect a condition; and based on such detection, the filter circuit 120 can be adjusted (e.g., adjustment of the tunable filter) to accommodate the condition. In some embodiments, such an adjustment of the filter circuit 120 can be facilitated by a controller 258 such as a MIPI (Mobile Industry Processor Interface) controller.

In the various examples described herein, a plurality of filtering levels are described as being provided by an assembly of a filter and a bypass path. Such plurality of filtering levels can include, for example, a non-zero attenuation level provided by the filter, and substantially nil attenuation level provided by the bypass path.

It will be understood that other levels of filtering levels can also be implemented to provide a plurality of filtering levels. Such filtering levels can be selected to, for example, accommodate different gains of an amplifier such as an LNA.

Figure 19:
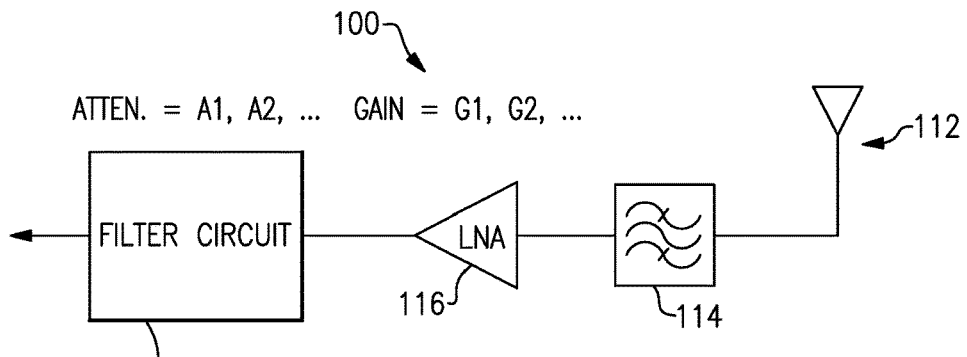
FIG. 19 shows that in some embodiments, a receive architecture having one or more features as described herein can include an antenna and a filter similar to the example of FIG. 5.

Accordingly, FIG. 19 shows that in some embodiments, a receive architecture 100 having one or more features as described herein can include an antenna 112 and a filter 114 similar to the example of FIG. 5. In the example of FIG. 19, an LNA 116 can be configured to provide a plurality of different gain values (e.g., G1, G2, etc.). In some embodiments, such different gains of the LNA 116 can be accommodated by a filter circuit 120 that can be configured to provide a plurality of different attenuation levels (e.g., A1, A2, etc.). In some embodiments, such a filter circuit can include, for example, one or more filters, one or more switches, one or more bypass paths, etc.

In some embodiments, the gain values of the LNA 116 in the example of FIG. 19 can vary continuously, as discrete values, or any combination thereof. Similarly, the attenuation values of the filter circuit 120 in the example of FIG. 19 can vary continuously, as discrete values, or any combination thereof.

Figure 20:
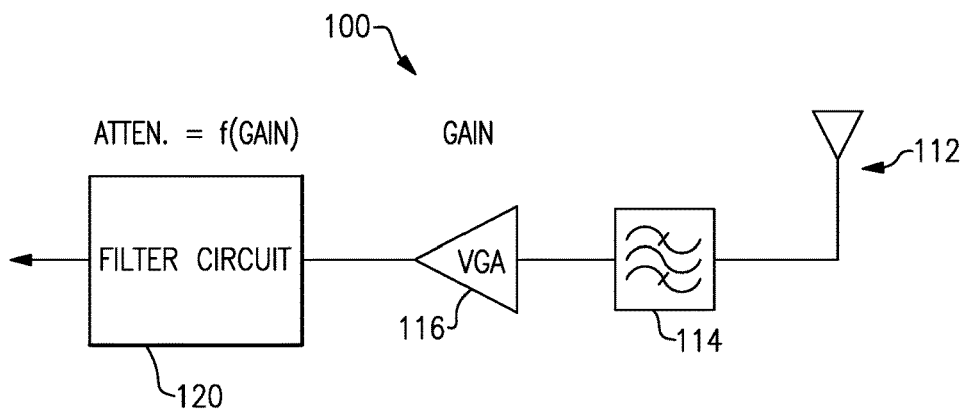
FIG. 20 shows a receive architecture in which an LNA can be implemented as a variable-gain amplifier (VGA).

FIG. 20 shows a receive architecture 100 in which an LNA can be implemented as a variable-gain amplifier (VGA) 116. Such a VGA is shown to have a gain (Gain) that can vary to accommodate different operating configurations.

FIG. 20 further shows that in some embodiments, a filter circuit 120 can be configured so that its attenuation level is a function of the gain of the VGA 116. It will be understood that the gain of the VGA 116 can vary continuously, as discrete values, or any combination thereof. Accordingly, the attenuation level provided by the filter circuit 120 can vary continuously, as discrete values, or any combination thereof.

In the various examples related to FIGS. 5-20, a filter (114) is assumed to be implemented between an antenna (112) and an amplifier (116). Such a filter is described as providing band-pass functionality with a given attenuation level.

Figure 21:
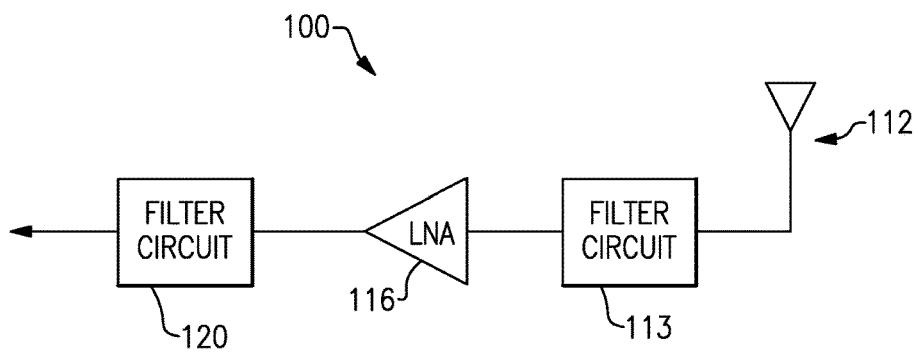
FIG. 21 shows that in some embodiments, one or more features of the present disclosure can also be implemented in a filter circuit to provide a plurality of filtering levels on the input side of an amplifier such as an LNA.

FIG. 21 shows that in some embodiments, one or more features of the present disclosure can also be implemented in a filter circuit 113 to provide a plurality of filtering levels on the input side of an amplifier 116 such as an LNA. In some embodiments, such a filter circuit can include, for example, one or more filters, one or more switches, one or more bypass paths, etc., similar to the filter circuit 120 of FIGS. 19 and 20.

In the example of FIG. 21, a filter circuit 120 is shown to be implemented on the output side of the LNA 116, similar to the example of FIGS. 19 and 20. In some embodiments, the filter circuits 113, 120 before and after the LNA 116 can be operated in cooperation with each other to provide a desired combination of filtering before and/or after the LNA 116.

In the example of FIG. 21, a filter circuit is shown to be implemented on each of the input and output sides of the LNA 116. It will be understood that in some embodiments, the input side of the LNA 116 can be provided with the filter circuit 113, and the output side of the LNA 116 can be provided with a fixed filter such as a band-pass filter.

Figure 22:
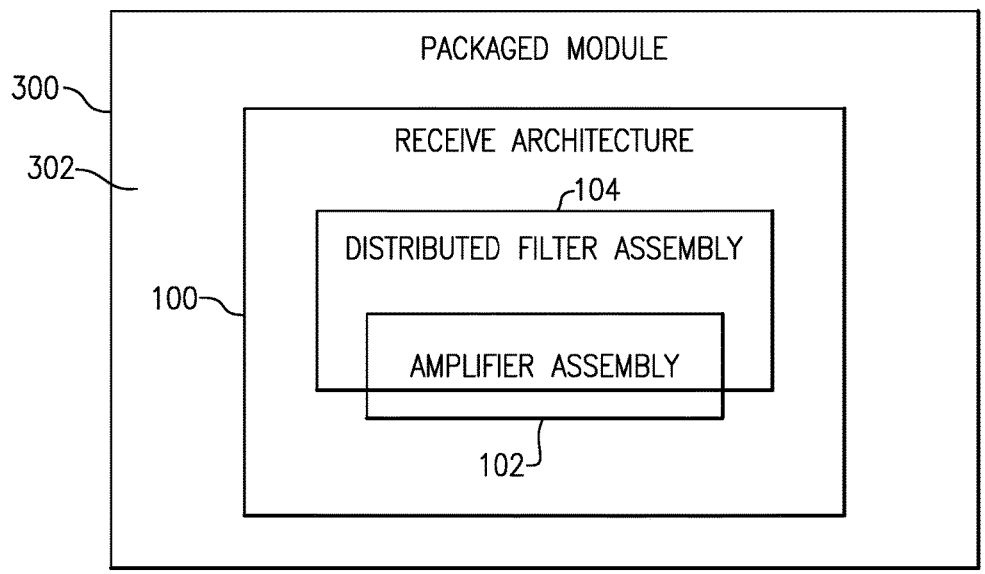
FIG. 22 shows that in some embodiments, some or all of a receive architecture having one or more features as described herein can be implemented on a packaged module.

FIG. 22 shows that in some embodiments, some or all of receive architecture 100 having one or more features as described herein can be implemented in a packaged module 300. Such a module can include a packaging substrate 302 configured to receive a plurality of components such as one or more die and one or more passive components.

In some embodiments, such components implemented on the packaging substrate 302 can include one or more die having an amplifier assembly 102. A distributed filter assembly 104 having one or more features as described herein can be implemented on the packaging substrate 302 so as to provide desirable functionalities.

In some implementations, an architecture, device and/or circuit having one or more features described herein can be included in an RF device such as a wireless device. Such an architecture, device and/or circuit can be implemented directly in the wireless device, in one or more modular forms as described herein, or in some combination thereof. In some embodiments, such a wireless device can include, for example, a cellular phone, a smart-phone, a hand-held wireless device with or without phone functionality, a wireless tablet, a wireless router, a wireless access point, a wireless base station, etc. Although described in the context of wireless devices, it will be understood that one or more features of the present disclosure can also be implemented in other RF systems such as base stations.

Figure 23:
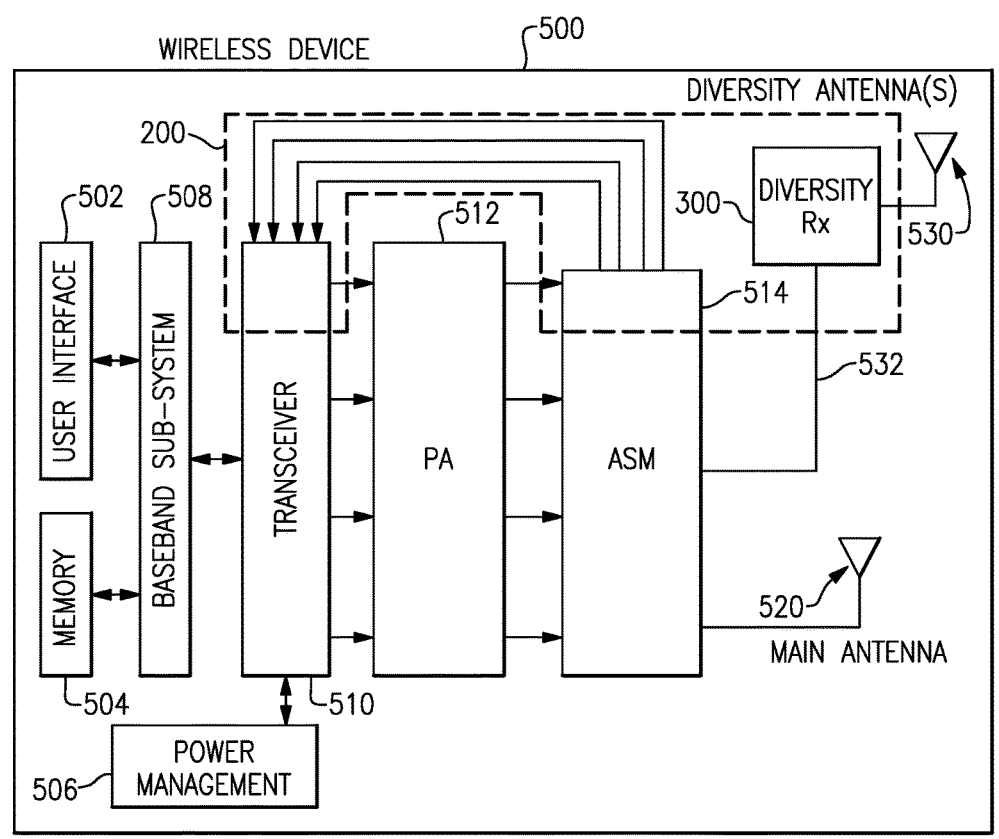
FIG. 23 depicts an example wireless device having one or more advantageous features described herein.

FIG. 23 depicts an example wireless device 500 having one or more advantageous features described herein. In some embodiments, a module having one or more features as described herein can be implemented as, for example, a diversity receive module 300. Such a module can be configured to operate with a diversity antenna 530 to provide one or more desirable features as described herein.

In some embodiments, a wireless system 200 having one or more features as described herein can be implemented as shown. For example, such a system can include some or all of the diversity receive module 300, some or all of an antenna switch module 514, and some or all of a transceiver 510.

In the example of FIG. 23, power amplifiers (PAs) in a PA module 512 can receive their respective RF signals from the transceiver 510 that can be configured and operated to generate RF signals to be amplified and transmitted, and to process received signals. The transceiver 510 is shown to interact with a baseband sub-system 508 that is configured to provide conversion between data and/or voice signals suitable for a user and RF signals suitable for the transceiver 510. The transceiver 510 is also shown to be connected to a power management component 506 that is configured to manage power for the operation of the wireless device 500.

Such power management can also control operations of the baseband sub-system 508 and other components of the wireless device 500.

The baseband sub-system 508 is shown to be connected to a user interface 502 to facilitate various input and output of voice and/or data provided to and received from the user. The baseband sub-system 508 can also be connected to a memory 504 that is configured to store data and/or instructions to facilitate the operation of the wireless device, and/or to provide storage of information for the user.

In the example of FIG. 23, the DRx module 300 can be implemented between one or more diversity antennas (e.g., diversity antenna 530) and the ASM 514. Such a configuration can allow an RF signal received through the diversity antenna 530 to be processed with little or no loss of and/or little or no addition of noise to the RF signal from the diversity antenna 530. Such processed signal from the DRx module 300 can then be routed to the ASM through one or more signal paths.

In the example of FIG. 23, a main antenna 520 can be configured to, for example, facilitate transmission of RF signals from the PA module 512. In some embodiments, receive operations can also be achieved through the main antenna.

A number of other wireless device configurations can utilize one or more features described herein. For example, a wireless device does not need to be a multi-band device. In another example, a wireless device can include additional antennas such as diversity antenna, and additional connectivity features such as Wi-Fi, Bluetooth, and GPS.

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

The above detailed description of embodiments of the invention is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The teachings of the invention provided herein can be applied to other systems, not necessarily the system described above. The elements and acts of the various embodiments described above can be combined to provide further embodiments.

While some embodiments of the inventions have been described, these embodiments have been presented by way of example only, and are not intended to limit the scope of the disclosure. Indeed, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A wireless architecture comprising:
a pre-amplifier band-pass filter configured to filter a signal with a rejection level having an absolute value of approximately G1;
an amplifier assembly configured to amplify the filtered signal with a gain having an absolute value of approximately G2; and
a filter circuit including a band-pass filter having a pass-band that is substantially the same as a pass-band of the pre-amplifier band-pass filter, the filter circuit configured to provide selective filtering of the amplified signal with a rejection level based on a difference between G2 and G1.

2. The wireless architecture of claim 1 wherein the signal is a received signal, and the amplifier assembly includes a low-noise amplifier.

3. The wireless architecture of claim 2 further comprising an antenna node implemented between the pre-amplifier filter and an antenna.

4. The wireless architecture of claim 1 wherein the rejection level of the filter circuit includes an absolute value of the difference between G2 and G1.

5. The wireless architecture of claim 1 wherein the filter circuit includes a notch filter configured to further reject a selected out-of-band portion of the amplified signal.

6. The wireless architecture of claim 1 wherein the filter circuit includes a tunable filter configured to further reject a selected out-of-band portion of the amplified signal.

7. The wireless architecture of claim 1 wherein the filter circuit is configured to provide filtering when in a first state and no filtering when in a second state.

8. The wireless architecture of claim 7 wherein the filter circuit includes an electrically parallel arrangement of a filtered path and a bypass path, implemented between a node associated with the amplifier assembly and a transceiver node, such that the amplified signal is routed through the filtered path or the bypass path.

9. The wireless architecture of claim 8 wherein the filter circuit further includes a switch implemented between the transceiver node and the parallel arrangement of the filtered path and the bypass path, the switch configured to allow routing of the amplified signal through the filtered path or the bypass path.

10. The wireless architecture of claim 9 wherein the filtered path includes the band-pass filter, and the amplifier assembly includes a low-noise amplifier.

11. The wireless architecture of claim 10 wherein the filter of the filtered path includes a notch filter configured to further reject a selected out-of-band portion of the amplified signal.

12. The wireless architecture of claim 11 wherein the selected out-of-band portion of the amplified signal includes some or all of a transmit signal at its frequency band.

13. The wireless architecture of claim 10 wherein the switch includes a pole connected to the transceiver node, a first throw connected to the filter of the filtered path, and a second throw connected to the bypass path.

14. The wireless architecture of claim 13 wherein the low-noise amplifier of the amplifier assembly includes a first amplification stage and a second amplification stage arranged in series with an inter-stage node between the first and second amplification stages.

15. The wireless architecture of claim 14 wherein the bypass path is connected to the inter-stage node, such that when the filtered circuit is in the first state, the amplified signal includes amplification by both of the first and second amplification stages, and when the filtered circuit is in the second state, the amplified signal includes amplification by the first amplification stage.

16. A packaged module for processing a signal, comprising:
- a packaging substrate configured to receive a plurality of components; and
- a receive architecture implemented on the packaging substrate, the receive architecture including a pre-amplifier band-pass filter configured to filter a signal with a rejection level having an absolute value of approximately G1; an amplifier assembly configured to amplify the filtered signal with a gain having an absolute value of approximately G2; and a filter circuit including a band-pass filter having a pass-band that is substantially the same as a pass-band of the pre-amplifier band-pass filter, the filter circuit configured to provide selective filtering of the amplified signal with a rejection level based on a difference between G2 and G1.

17. A wireless device comprising:
an antenna configured to receive a signal;
a receive architecture in communication with the antenna and including a pre-amplifier band-pass filter configured to filter a signal with a rejection level having an absolute value of approximately G1; an amplifier assembly configured to amplify the filtered signal with a gain having an absolute value of approximately G2; and a filter circuit including a band-pass filter having a pass-band that is substantially the same as a pass-band of the pre-amplifier band-pass filter, the filter circuit configured to provide selective filtering of the amplified signal with a rejection level based on a difference between G2 and G1; and
a transceiver in communication with the filter circuit and configured to process the selectively filtered signal.

* * * * *